United States Patent
Sandhu et al.

(10) Patent No.: US 8,076,717 B2
(45) Date of Patent: Dec. 13, 2011

(54) VERTICALLY-ORIENTED SEMICONDUCTOR SELECTION DEVICE FOR CROSS-POINT ARRAY MEMORY

(75) Inventors: Gurtej Sandhu, Boise, ID (US); Chandra Mouli, Boise, ID (US); John K. Zahurak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 213 days.

(21) Appl. No.: 12/469,433

(22) Filed: May 20, 2009

(65) Prior Publication Data

US 2010/0295119 A1 Nov. 25, 2010

(51) Int. Cl.
*H01L 29/66* (2006.01)
(52) U.S. Cl. ........ 257/329; 257/296; 257/303; 257/314; 257/318; 257/330
(58) Field of Classification Search .......... None
See application file for complete search history.

(56) References Cited

U.S. PATENT DOCUMENTS

| | | | |
|---|---|---|---|
| 5,460,988 A * | 10/1995 | Hong | 438/259 |
| 6,300,198 B1 | 10/2001 | Aeugle et al. | |
| 7,247,876 B2 | 7/2007 | Lowrey | |
| 7,391,664 B2 | 6/2008 | Parkinson et al. | |
| 2004/0206996 A1* | 10/2004 | Lee et al. | 257/296 |
| 2006/0017088 A1 | 1/2006 | Abbott et al. | |
| 2008/0035958 A1 | 2/2008 | Asao | |
| 2008/0049486 A1 | 2/2008 | Gruening-von Schwerin | |
| 2008/0099814 A1 | 5/2008 | Gruening-von Schwerin et al. | |
| 2008/0224178 A1 | 9/2008 | Pacha et al. | |
| 2008/0273369 A1 | 11/2008 | Angerbauer et al. | |
| 2008/0277642 A1 | 11/2008 | In T Zandt et al. | |

* cited by examiner

*Primary Examiner* — N Drew Richards
*Assistant Examiner* — Kyoung Lee
(74) *Attorney, Agent, or Firm* — Dickstein Shapiro LLP (57) ABSTRACT

A vertical semiconductor material mesa upstanding from a semiconductor base that forms a conductive channel between first and second doped regions. The first doped region is electrically coupled to one or more first silicide layers on the surface of the base. The second doped region is electrically coupled to a second silicide layer on the upper surface of the mesa. A gate conductor is provided on one or more sidewalls of the mesa.

19 Claims, 6 Drawing Sheets

VERTICALLY-ORIENTED SEMICONDUCTOR SELECTION DEVICE FOR CROSS-POINT ARRAY MEMORY

CROSS-REFERENCE TO RELATED APPLICATIONS

This application is related to U.S. patent application Ser. No. 12/469,563, filed concurrently herewith, the specification of which is herein incorporated by reference in its entirety.

FIELD OF THE INVENTION

The embodiments disclosed herein relate generally to the field of semiconductor selection devices and, more particularly, to access devices for semiconductor memory devices.

BACKGROUND OF THE INVENTION

A non-volatile memory device is capable of retaining stored information even when power to the memory device is turned off. Traditionally, non-volatile memory devices occupied large amounts of space and consumed large quantities of power. As a result, non-volatile memory devices have been widely used in systems where limited power drain is tolerable and battery-life is not an issue. However, as systems requiring non-volatile memories have continued to shrink in size, improvements in non-volatile memory devices have been sought in order to make these devices more suitable for use in portable electronics or as substitutes for frequently-accessed volatile memory devices. Desired improvements include decreasing the size and power consumption of these memories and improving the memory access devices.

Improved non-volatile memory devices under research include resistive memory cells where resistance states can be programmably changed. Resistive memory cells store data by structurally or chemically changing a physical property of the memory cells in response to applied programming voltages, which in turn changes cell resistance. Examples of variable resistance memory devices being investigated include memories using variable resistance polymers, perovskite materials, doped amorphous silicon, phase-changing glasses, and doped chalcogenide glass, among others. Phase change memory ("PCM") cells have varying resistances as a result of changes in the crystal phase of the cell material, Spin-tunneling random access memory ("STRAM") cells have varying resistances as a result of changes in current induced magnetization of the cell material.

For many resistive memory cells, changing the cell resistance is accomplished by passing an electrical current of sufficient strength through the resistive memory cell. For phase change memory cells and spin-tunneling memory cells, for example, programming and reset currents of 50 to 100 μA are not uncommon. However, these high currents result in extremely high current densities as the size of the memory cells continues to shrink. For example, for a 20×20 $nm^2$ memory cell, the resulting current density is of the order of $1\times10^7$ $A/cm^2$ or greater. For such high current densities, improved memory access devices are desired to provide high currents and low "off" state leakage.

Improved access devices such as those desired for use with resistive memory cells could also be used to provide high currents to any type of memory or semiconductor circuit that requires a high current.

DETAILED DESCRIPTION OF THE INVENTION

Traditional memory access devices are planar in nature, meaning that the access devices are formed layer by layer within the plane of the underlying structure. The underlying structure includes a substrate that is a base material and layers formed on the surface of the substrate. The substrate and overlaying layers on top of the substrate are flat or planar. The access devices are formed within these layers so that the resulting devices are also laid out in a planar arrangement. As a specific example, a planar field-effect transistor ("FET") is a FET with a conductive channel that is within the layers of the underlying structure. Planar access devices have a relatively large footprint since area is required for source and drain contacts as well as isolation between the contacts.

Non-planar access devices are alternatives to planar devices. Non-planar access devices are access devices that are not flat or planar and can be oriented in a vertical direction from a substrate. These devices can include raised portions that extend above the planar surface of the underlying structure. An example of a non-planar access device is a fin-FET. A fin-FET is a FET that includes thin vertical "fins" of the underlying substrate material that act as the transistor body. The source and drain of the fin-FET are located at the ends of the fin, while one or more gates are located on a surface of the fin. Upon activation, current flows through the fin. The thin vertical structure results in significant space savings over traditional planar access devices.

Figure 1:
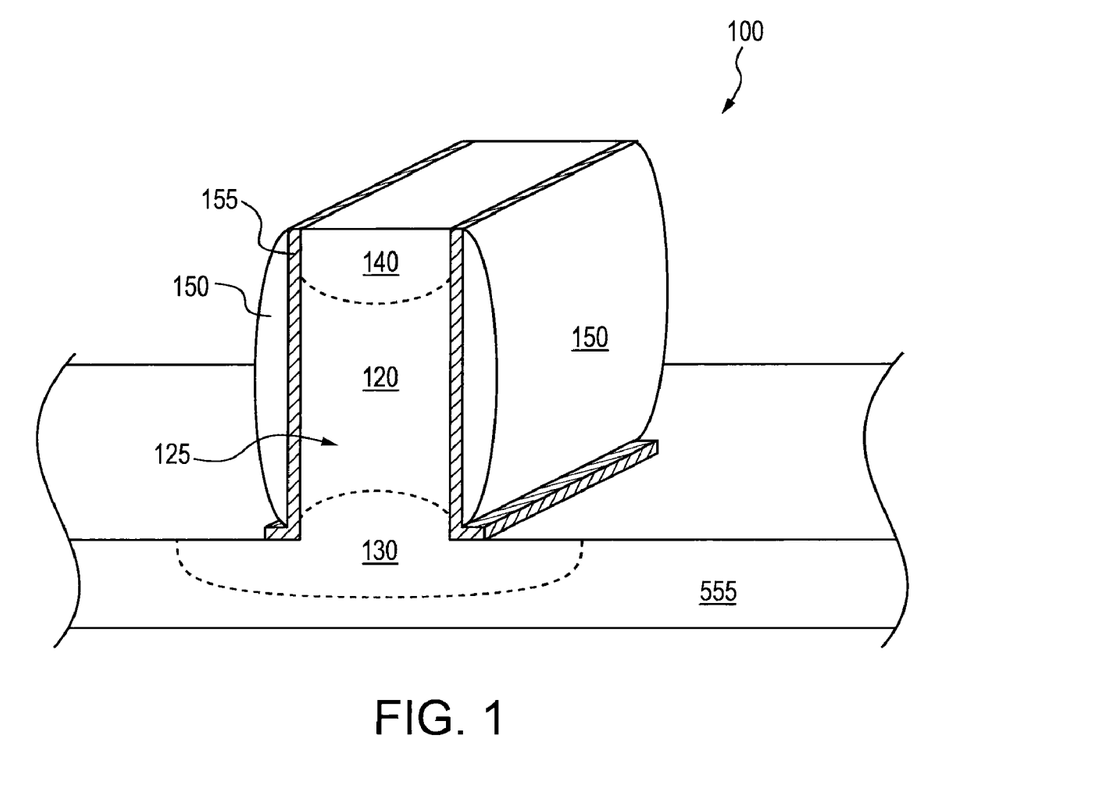
FIG. 1 illustrates a vertically-oriented semiconductor transistor device.

FIG. 1 illustrates a vertical FET 100. The vertical FET 100 includes a thin vertical fin or mesa 120 through which current flows vertically between a source 130 and a drain 140. The mesa 120 extends above a substrate 555. In the example vertical FET 100, the substrate 555 and the mesa 120 are formed of silicon. The source 130 and drain 140 regions are both either n-doped or p-doped, while a vertical current channel 125 is either p-doped or n-doped, accordingly. A gate 150 is formed along a sidewall of the mesa 120. Additional gates 150 may be formed. In the example of FIG. 1, two gates 150 are formed on opposite sidewalls of the mesa 120, although vertical FET 100 may also be formed with only a single gate 150. Gates 150 are separated from the sidewalls of the mesa 120 by thin gate insulators 155 such as a gate oxide layer. The thin gate insulators 155 are L-shaped in order to insulate the gates 150 from contact with the mesas 120 and the substrate 555 or any conductor on the substrate 555. The gates 150 may be formed of polysilicon. When an appropriate bias is applied to one or more of the gates 150, current flows vertically through the channel 125 from the source 130 to the drain 140.

Figure 2A:
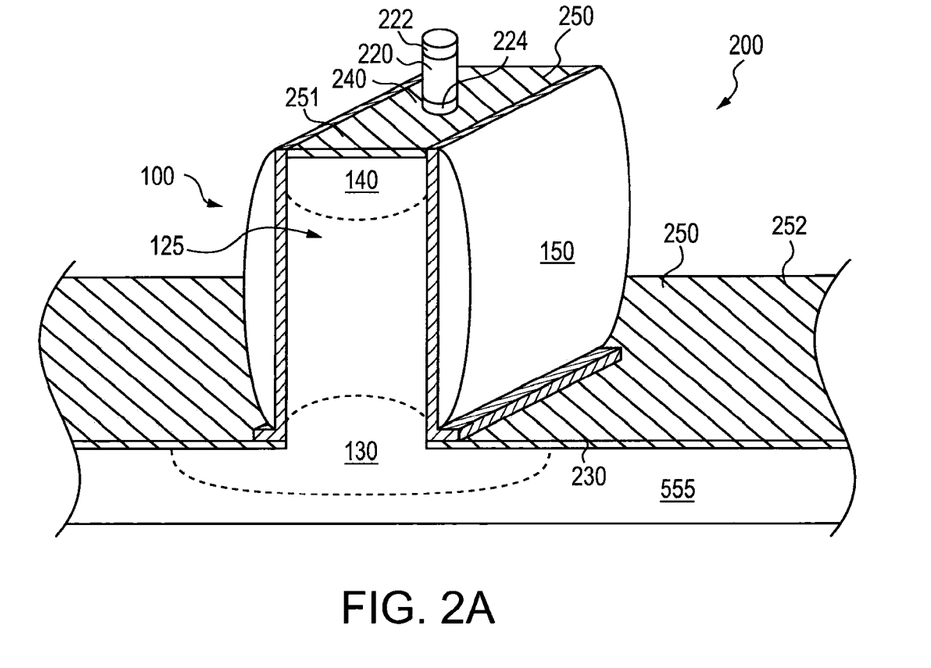
FIGS. 2A and 2B illustrate a memory cell and a memory access device, according to one or more embodiments of the disclosure.
Figure 2B:
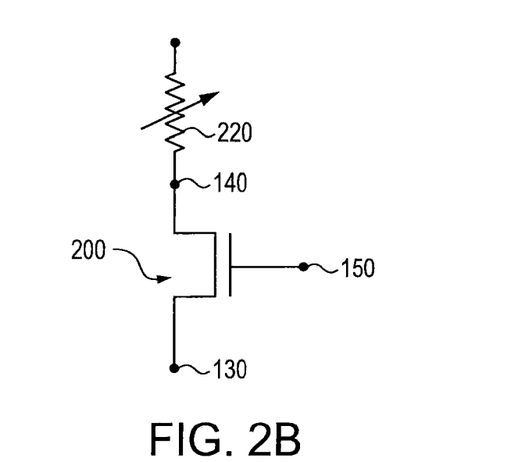

In a disclosed embodiment, the vertical FET 100 may be used as a selection device such as a memory access device 200 for one or more electrical devices, as illustrated in the structure of FIG. 2A and the schematic diagram of FIG. 2B. In FIG. 2A, a memory cell 220 is electrically coupled to the vertical FET device 200. The memory cell 220 includes a top electrode 222 and a bottom electrode 224. The bottom electrode 224 is coupled to a contact 240 for the drain 140. The source 130 is coupled to a contact 230. Upon appropriate biasing of the source contact 230, the gate 150 and the top electrode 222, the vertical FET 100 is turned "on" and current flows through the channel 125 and memory cell 220. With appropriate biasing, the current flowing through the memory cell 220 is strong enough to be used as a programming or reset current for the memory cell 220.

The memory access device 200 and the memory cells 220 are generally formed in an array of access devices 200 and memory cells 220. Thus, the source contact 230 may extend a relatively long distance from the source 130 of memory access device 200 to the nearest voltage source. Additionally, source contacts 230 may be shared by multiple access devices. In order to facilitate the shared contacts 230 and to minimize the effect of parasitic resistance, the contacts 230 are formed of metal silicide 250. In other words, the substrate 555 surface near the bottom of the mesa 120 is silicided with metal such as Ni, Co or Ti. The metal silicide 250 (also known as a salicide) near the bottom of the mesa 120 (or the source metal silicide layer 252) acts to reduce the series resistance that results from using a common current source contact for each individual access device 200 in an array. The source contacts 230 may also be formed of heavily doped silicon as long as the resistance of the doped silicon is low enough to carry the required current.

Additionally, the drain contact 240 is also formed of a metal silicide 250 which helps to reduce contact resistance between the access device 200 and the bottom electrode 224 of the memory cell 220. The metal silicide 250 formed on the upper portion of the access device 200 is the drain metal silicide layer 251.

Figure 3A:
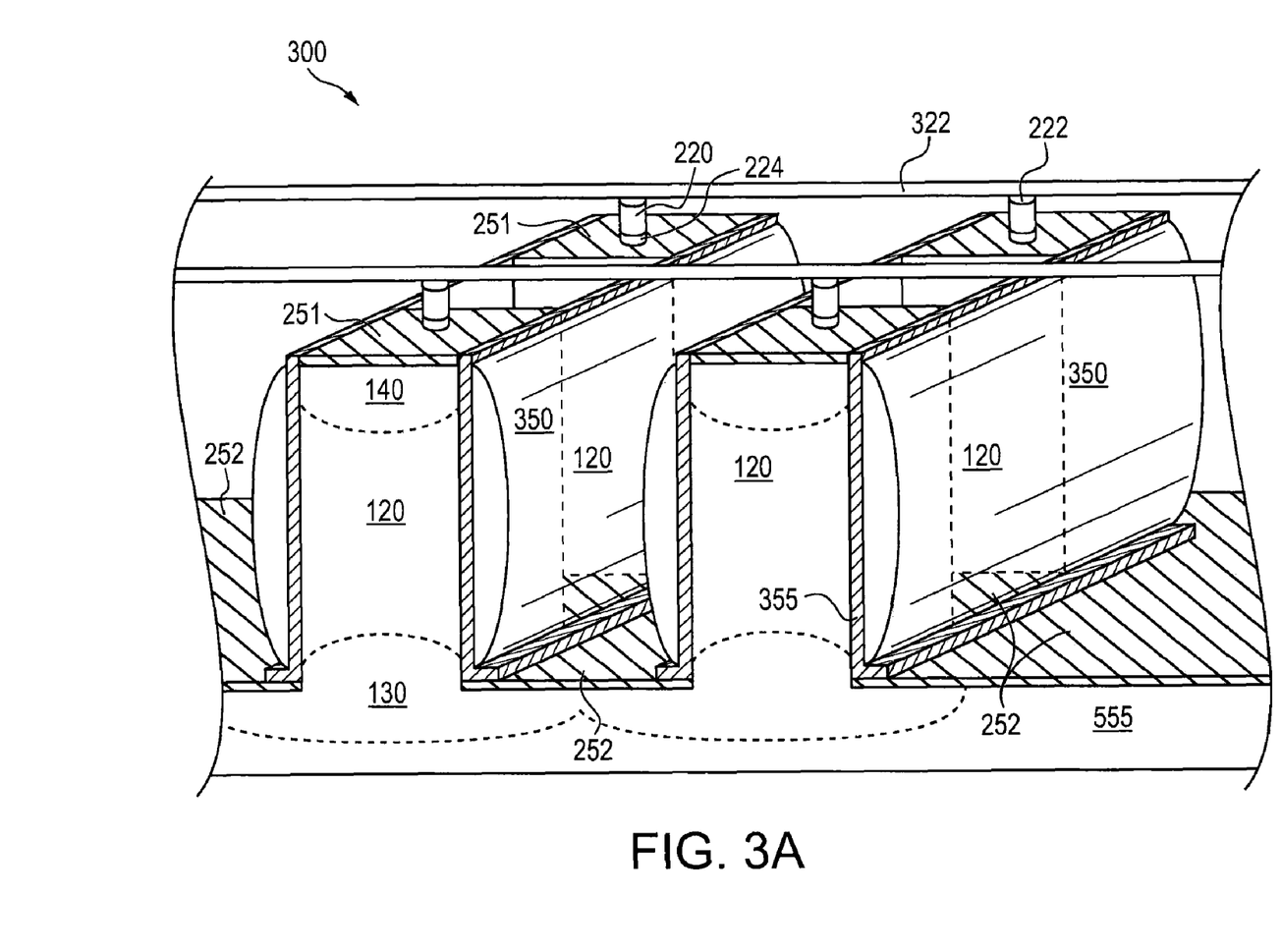
FIGS. 3A, 3B and 3C illustrate an array of memory cells and memory access devices, according to one or more embodiments of the disclosure.

In a disclosed embodiment, the access devices 200 and the memory cells 220 are arranged in an array 300 as illustrated in FIG. 3A. In FIG. 3A, a silicon substrate 555 is shown. Rising from the silicon substrate 555 are four silicon mesas 120. Other substrate and mesa material, such as Ge, SiC, GaN, GaAs, InP, carbon nanotube and graphene, for example, may be used instead of silicon. Additionally, the array 300 generally includes many more than just four mesas. The illustration of the array 300 is simplified in order to aid explanation.

The mesas 120 each include source 130, drain 140 and gate 350 regions. The gate 350 regions are formed on one or more sidewalls of the silicon mesas 120 and are commonly shared between mesas 120. In the example of FIG. 3A, gates 350 are formed on two opposite sides of each mesa 120, thus forming double-gated vertical FETs. Single-gated vertical FETs (i.e., only one gate 350 on a mesa 120) or surround-gated vertical FETs (i.e., the gate 350 surrounds mesa 120) may also be formed. The sidewall gates 350 extend along the column of mesas 120 so that each column of mesas 120 includes at least one common sidewall gate 350. The sidewall gates 350 may also be silicided. The source 130 regions of each mesa 120 are electrically coupled with the source metal silicide layer 252 which covers the surface of the silicon substrate 555. In this way, source 130 regions for multiple mesas 120 are electrically coupled together to form shared sources 130. Source 130 regions may also merge into a single common source 130. The drain 140 regions are electrically coupled to the drain metal silicide layer 251 which covers the top portion of the mesas 120. The gates 350 are insulated from the silicide layers 251, 252 by the thin gate insulator 155. In order to further insulate gates 350 from the silicide layers 251, gate 350 need not extend all the way to the top edge of the mesas 120.

The memory cells 220 are electrically coupled via a bottom electrode 224 to the drain metal silicide layer 251 located on the upper surfaces of the mesas 120. The top electrode 222 of each memory cell 220 is electrically coupled to a conductor 322. In one embodiment, conductor 322 may extend horizontally in a direction perpendicular to the direction that the sidewall gates 350 extend. Other array layouts are contemplated where conductor 322 may extend in a direction other than perpendicular to sidewall gates 350.

Figure 3B:
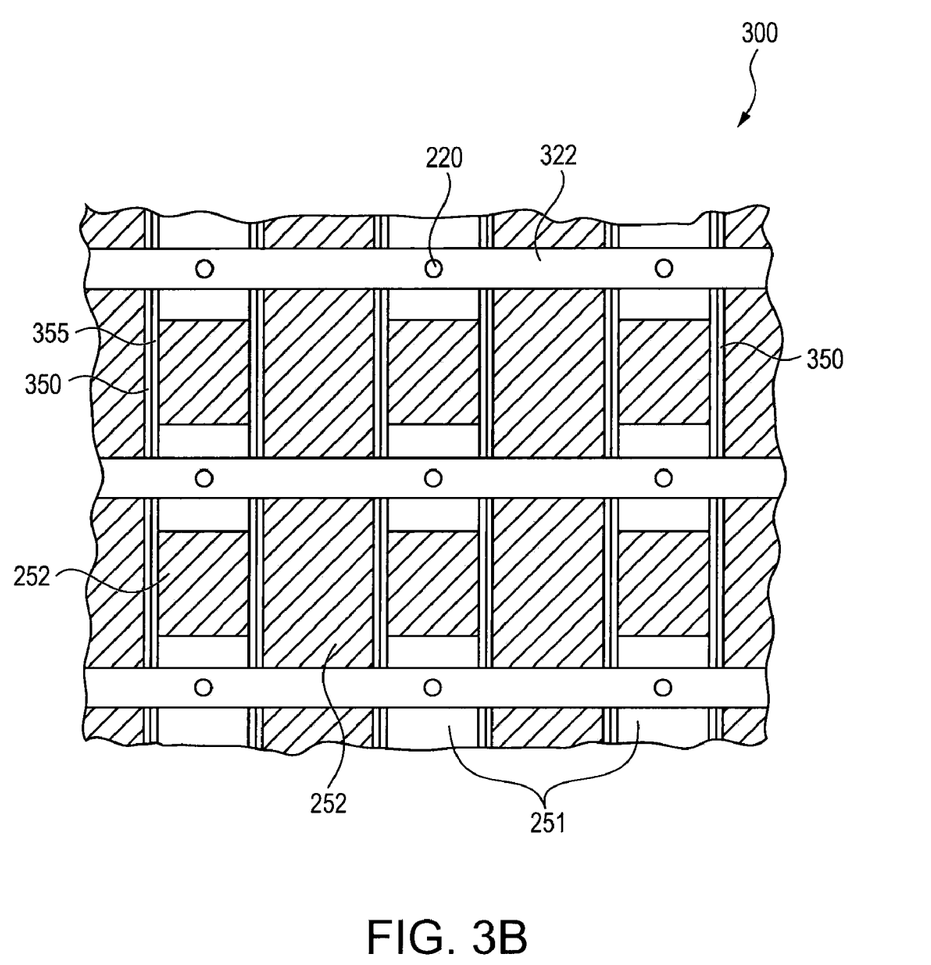
Figure 3C:
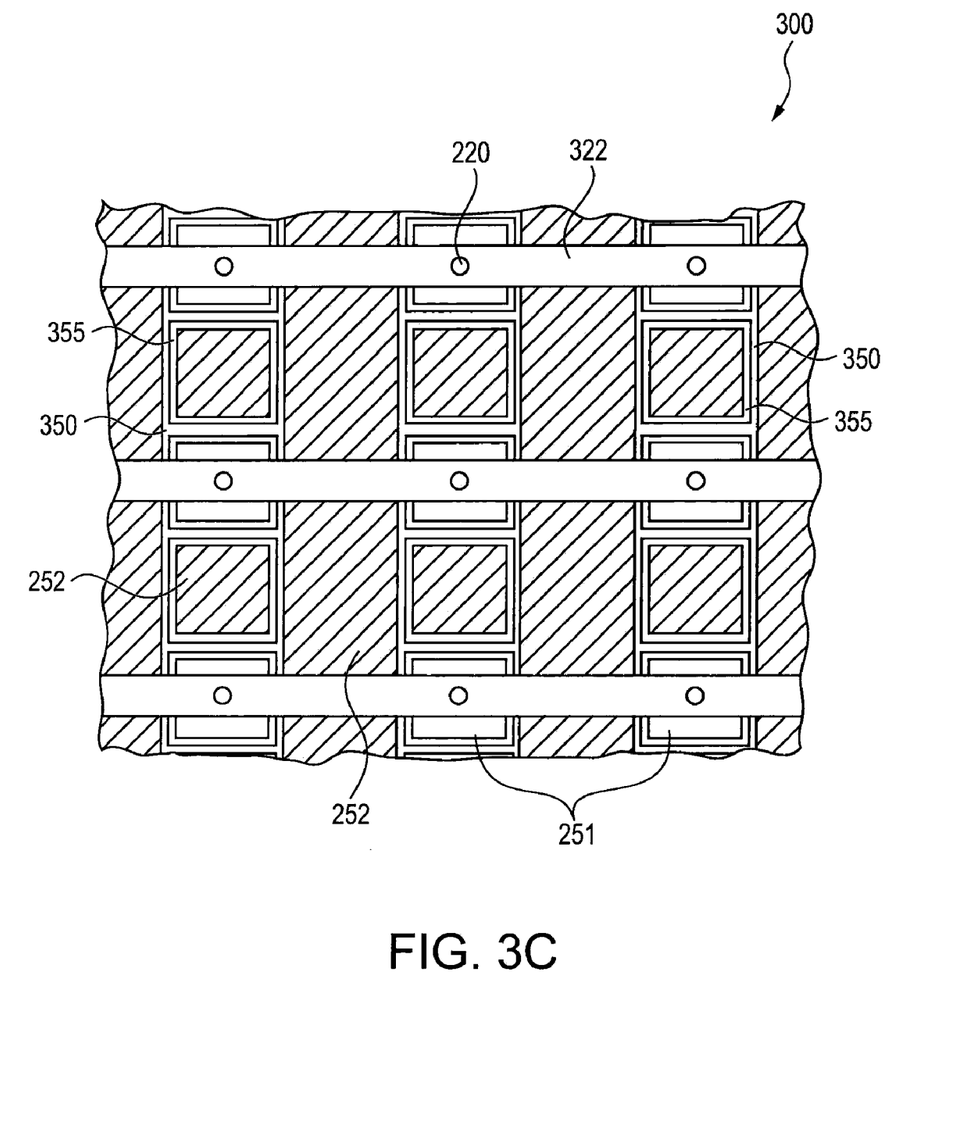

A simplified top view of the array 300 is illustrated in FIG. 3B. From the top view, it is apparent that all access devices 200 and memory cells 220 share a common source metal silicide layer 252 that surrounds the base of each mesa 120. Access devices 200 in the same column share a common gate 350. Additionally, gates 350 may be formed on all sides of each access device 200, resulting in a surround-gated vertical FET, as illustrated in FIG. 3C. Memory cells 220 in the same row share a common conductor 322. The common conductor 322 may be made of metal, but may also be made of other conductive materials such as polysilicon, for example. Memory cells 220 are coupled to the upper portion of each mesa 120 via a drain metal silicide layer 251.

Individual memory cells 220 are activated (meaning that a desired current flows through the memory cell 220) by the appropriate biasing of the source 130, the respective gate 350 and the respective conductor 322. While biasing the source 130 or any one of the gates 350 or conductors 322 may affect multiple memory cells 220, activation of a specific memory cell 220 is only accomplished through the appropriate biasing of that cell's gate 350 and conductor 322.

By using a common source 130 and by surrounding the base of each mesa 120 with a metal silicide 250 (the source metal silicide layer 252), the parasitic resistance in the source is reduced. The source metal silicide layer 252 provides additional current paths, resulting in higher current flow. In this example, because every mesa 120 shares a common source 130, a dedicated contact is not required for any specific strip of source metal silicide layer 252. Thus, efficiency of current flow through the source metal silicide layer 252 to a specific mesa 120 may be improved. Additionally, by using a drain metal silicide layer 251 on the top surface of each mesa 120, the contact resistance between the access device 200 and the bottom electrode 224 of each memory cell 220 is reduced.

The memory access devices of array 300 are able to provide large amounts of current through any selected memory cell 220. In array 300, access devices share common sources 130 because of the source metal silicide layers 252. Mesas 120 in the array 300 share a common source 130. Thus, the source metal silicide layer 252 helps to facilitate a larger source current.

Figure 4:
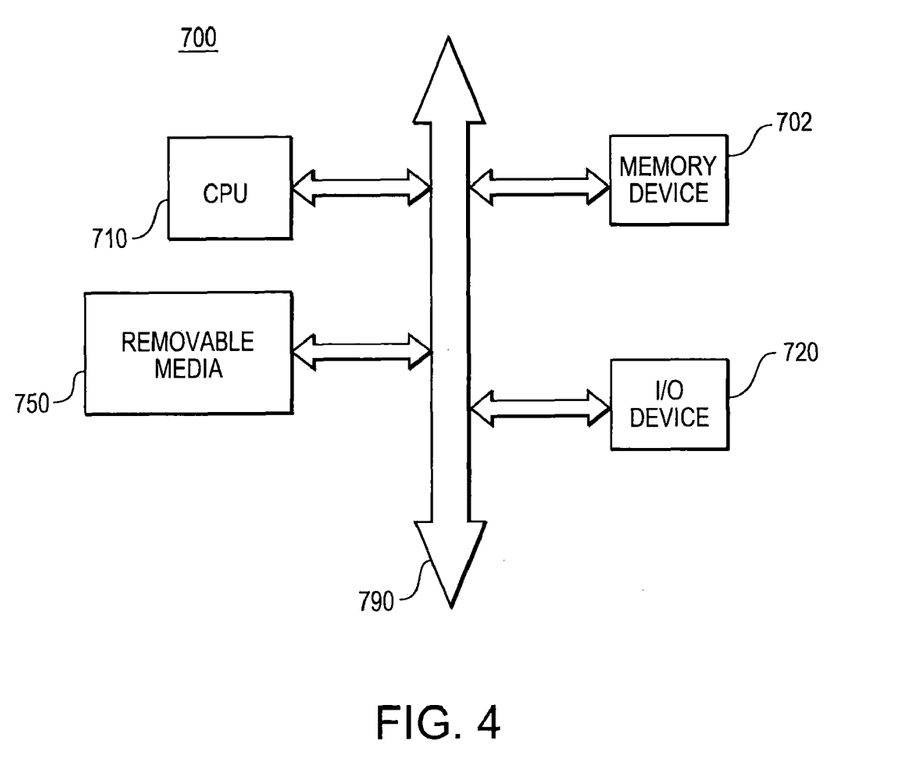
FIG. 4 illustrates a processing system utilizing a memory array, according to one or more embodiments of the disclosure.

It should be appreciated that the array 300 may be fabricated as part of an integrated circuit. The corresponding integrated circuits may be utilized in a processor system. For example, FIG. 4 illustrates a simplified processor system 700, which includes a memory device 702 that includes array 300 in accordance with any of the above described embodiments. A processor system, such as a computer system, generally comprises a central processing unit (CPU) 710, such as a microprocessor, a digital signal processor, or other programmable digital logic devices, which communicates with an input/output (I/O) device 720 over a bus 790. The memory device 702 communicates with the CPU 710 over bus 790 typically through a memory controller.

In the case of a computer system, the processor system 700 may include peripheral devices such as removable media devices 750 (e.g., CD-ROM drive or DVD drive) which communicate with CPU 710 over the bus 790. Memory device 702 can be constructed as an integrated circuit, which includes one or more phase change memory devices. If desired, the memory device 702 may be combined with the processor, for example CPU 710, as a single integrated circuit.

The above description and drawings should only be considered illustrative of exemplary embodiments that achieve the features and advantages described herein. Modification and substitutions to specific process conditions and structures can be made. Accordingly, the claimed invention is not to be considered as being limited by the foregoing description and drawings, but is only limited by the scope of the appended claims.

What is claimed as new and desired to be protected by Letters Patent of the United States is:

1. A transistor comprising:
   a semiconductor material base;
   a semiconductor material mesa upstanding from said base;
   a first silicide on an upper surface of said mesa;
   a second silicide supported on said base and abutting against at least a first side of said mesa for supplying an electrical connection to said mesa;
   first and second regions respectively coupled to the first and second silicide, the first and second regions being doped to a first type and one or more channel regions between the first and second regions being doped to a second type; and
   a first mesa sidewall gate structure provided on said first side of said mesa and comprising a gate insulator material and an overlying gate conductor, said first gate structure being operative to control current flow in said channel regions between said first and second silicides through said mesa.

2. A transistor as in claim 1, wherein said gate insulator is a gate oxide.

3. A transistor as in claim 1, wherein said gate conductor comprises polysilicon.

4. A transistor as in claim 1, further comprising:
   a third silicide supported on said base at a second side of said mesa opposite said first side; and
   a second mesa sidewall gate structure provided on said second side of said mesa and comprising a gate insulator material and an overlying gate conductor, said second gate structure being operative to control with said first gate structure current flow between said first and second and first and third silicides through said mesa.

5. A transistor as in claim 1, further comprising a plurality of operative electrical devices respectively connected to each of said first silicides.

6. A transistor as in claim 1, wherein said mesa comprises silicon.

7. A transistor as in claim 1, wherein said mesa is formed of a material selected from the group consisting of Si, Ge, SiC, GaN, GaAs, InP, carbon nanotube and graphene.

8. A transistor comprising:
   a semiconductor material base;
   at least one linearly extending semiconductor mesa structure, upstanding from said base;
   at least one first silicide material element extending along an upper level of each mesa structure in said linear direction;
   a second silicide material element on said semiconductor material base abutting against at least a first side of said at least one linear extending mesa structure for providing an electrical connection to said mesa structure; and
   a first mesa sidewall gate structure provided on said first side of said mesa structure and comprising a gate insulator material and an overlying gate conductor, said first gate structure being operative to control current flow between said first and second silicide material elements through said mesa structure.

9. A transistor as in claim 8, wherein said at least one linearly extending mesa structure comprises a continuous linearly extending mesa and wherein said at least one first silicide element extends continuously along the upper surface of said continuously extending mesa structure.

10. A transistor as in claim 8, wherein said at least one linearly extending mesa structure comprises a plurality of discrete mesas and wherein said at least one first silicide element comprises a plurality of first silicide elements respectively provided on an upper surface of said plurality of discrete mesas.

11. A transistor as in claim 10, further comprising a plurality of linearly extending mesa structures, each comprising a plurality of discrete mesas spaced in a line,
    wherein said at least one first silicide element comprises a plurality of first silicide elements respectively provided on an upper surface of each of said discrete mesas, and
    wherein said first mesa sidewall gate structure comprises a plurality of continuous sidewall gate structures respectively provided for each line spanning the discrete mesas in a said line.

12. A transistor as in claim 10, wherein a second silicide material element is supported at and extends along a first side of each of said discrete mesas in a line.

13. A memory array comprising:
    a semiconductor material base;
    a plurality of linearly extending semiconductor mesas upstanding from said base, spaced from one another and arranged in parallel;
    a plurality of first silicide elements respectively extending along an upper level of each of said mesas in said linear direction;
    a plurality of second silicide elements respectively on said base at least at a first side of each mesa structure;
    a plurality of first mesa sidewall gate structures respectively provided on said first side of each of said linearly extending mesa and each comprising a gate insulator material and an overlying gate conductor, first gate structures being operative to control current flow between said respective first and second silicide elements through said respective mesa structure;
    a plurality of memory cells, each electrically coupled via a first side of said memory cell to one of said first silicide elements; and
    a plurality of conductive lines arranged so that each of said memory cells is electrically coupled via a second side of said memory cell to one of said conductive lines so that no two memory cells are electrically coupled to the same first silicide element and the same conductive line.

14. The memory array as in claim 13, wherein more than one memory cell is coupled to the same first silicide element.

15. The memory array as in claim 14, wherein said second silicide element is supported and extends along said base at a first side of each of said plurality of linearly extending mesas.

16. The memory array as in claim 15, further comprising a second mesa sidewall gate respectively provided on a second side of each of said linearly extending mesas.

17. The memory array as in claim 16, wherein said second silicide material element is supported at and extends along a second side of said plurality of linearly extending mesas.

18. A memory array comprising:
    a semiconductor material base;
    a plurality of semiconductor mesa structures, upstanding from said base, spaced from one another within one or more lines of mesa structures;

a plurality of first silicide elements respectively extending along an upper level of each of said mesa structures;

a plurality of connected second silicide elements respectively supported on said semiconductor material base at least at a first side of each mesa structure for providing an electrical connection to said respective mesa structures;

a plurality of first mesa sidewall gate structures respectively provided on said first side of each of said mesas and extending linearly so that a gap between each of said mesa structures in a line is spanned by said gate structure, each gate structure comprising a gate insulator material and an overlying gate conductor, said first gate structures being operative to control current flow between said respective first and second silicide elements through said respective mesa structure;

a plurality of memory cells, each electrically coupled via a first side of said memory cell to a respective one of said first silicide elements; and a plurality of conductive lines arranged so that each of said memory cells is electrically coupled via a second side to one of said conductive lines so that no two memory cells are electrically coupled to the same first silicide material element and the same conductive line.

19. A memory array as in claim 18, further comprising a plurality of second mesa sidewall gate structures, each respectively provided to span a second side of each of said mesa structures in a line.

* * * * *

UNITED STATES PATENT AND TRADEMARK OFFICE
CERTIFICATE OF CORRECTION

PATENT NO.       : 8,076,717 B2                               Page 1 of 1
APPLICATION NO.  : 12/469433
DATED            : December 13, 2011
INVENTOR(S)      : Gurtej Sandhu et al.

It is certified that error appears in the above-identified patent and that said Letters Patent is hereby corrected as shown below:

In column 9, line 9, in Claim 19, delete "A" and insert -- The --, therefor.

Signed and Sealed this
Twenty-first Day of February, 2012

David J. Kappos
*Director of the United States Patent and Trademark Office*